(12) United States Patent
Zhou et al.

(10) Patent No.: US 6,239,599 B1
(45) Date of Patent: May 29, 2001

(54) METHOD AND APPARATUS FOR IDENTIFYING ERRORS IN MAGNETIC RESONANCE IMAGING EXAMINATIONS

(75) Inventors: Xiaohong Zhou, Houston, TX (US); Joseph K. Maier, Milwaukee; Steven J. Huff, Hartland, both of WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/316,344

(22) Filed: May 21, 1999

(51) Int. Cl.[7] .................................................. G01V 3/00
(52) U.S. Cl. ............................................ 324/309; 324/307
(58) Field of Search ..................................... 324/309, 307, 324/306, 300, 312, 314

(56) References Cited

U.S. PATENT DOCUMENTS

| | | | |
|---|---|---|---|
| 5,151,656 | 9/1992 | Maier et al. ........................ | 324/309 |
| 5,770,943 | * 6/1998 | Zhou ................................... | 324/307 |
| 5,864,233 | 1/1999 | Zhou et al. ......................... | 324/309 |
| 6,127,826 | * 10/2000 | Thompson et al. ................. | 324/307 |

OTHER PUBLICATIONS

Xiaohong Zhou, Joseph K. Maier and H. Glenn Reynolds; "Reduction of Image Misregistration in Diffusion–Weighted EPI"; International Society for Magnetic Resonance in Medicine Fifth Scientific Meeting; Apr. 12, 1997.

Xiaohong Zhou, and H. Glenn Reynolds; "Quantitative Analysis of Eddy Current Effects on Diffusion–Weighted EPI"; International Society for Magnetic Resonance in Medicine Fifth Scientific Meeting; Apr. 12, 1997.

* cited by examiner

*Primary Examiner*—Louis Arana
(74) *Attorney, Agent, or Firm*—Fletcher, Yoder & Van Someren

(57) ABSTRACT

A technique is disclosed for determining errors in MRI sequences resulting from eddy currents generated by pulsed gradient fields. During a calibration sequence, with no phase-encoding, gradient pulses and readout sequences are applied along physical axes of a scanner and data sets are acquired for each combination. A reference data set is acquired with no gradient pulses applied. The resulting data sets are processed by one dimensional Fourier transformation, and the transformed data is analyzed to determine spatially invariant and linear gradient errors. The phase errors may be averaged for each physical axis. The technique is particularly useful in determining errors in diffusion weighted echo planar imaging sequences.

28 Claims, 6 Drawing Sheets

METHOD AND APPARATUS FOR IDENTIFYING ERRORS IN MAGNETIC RESONANCE IMAGING EXAMINATIONS

FIELD OF THE INVENTION

The present invention relates generally to magnetic resonance imaging systems such as those used for medical diagnostics purposes. More particularly, the invention relates to a technique for measuring and identifying errors in certain types of examinations, particularly diffusion-weighted, echo planar imaging sequences, such as errors resulting from eddy currents produced by gradients of the pulse sequences.

BACKGROUND OF THE INVENTION

Magnetic resonance imaging (MRI) systems have become ubiquitous in the field of medical diagnostics. Over the past decades, improved techniques for MRI examinations have been developed that now permit very high quality images to be produced in a relatively short time. As a result, diagnostic images with varying degrees of resolution are available to the radiologist that can be adapted to particular diagnostic applications.

In general, MRI examinations are based on the interactions among a static magnetic field, a radio frequency (RF) magnetic field and time varying magnetic field gradients with nuclear spins within the subject of interest. The nuclear spins, such as hydrogen nuclei in water molecules, have characteristic behaviors in response to external magnetic fields. The precession of such nuclear spins can be influenced by manipulation of the fields to obtain RF signals that can be detected, processed, and used to reconstruct a useful image.

The magnetic fields used to produce images in MRI systems include a highly uniform, static main magnetic field that is produced by a magnet. A series of gradient fields are produced by a set of three coils disposed around the subject. The gradient fields encode positions of individual volume elements or voxels in three dimensions. A radio frequency coil is employed to produce an RF magnetic field. This RF magnetic field perturbs the spin system from its equilibrium. Upon returning to the equilibrium after the termination of the RF field, an RF signal can be emitted. Such emissions are detected by either the same transmitting RF coil, or by a separate receive-only coil. These signals are amplified, filtered, and digitized. The digitized signals are then processed using one of several possible reconstruction algorithms to form a final image.

Many specific techniques have been developed to acquire MR images for a variety of applications. One major difference among these techniques is in the way gradient pulses and RF pulses are used to manipulate the spin systems to yield different image contrasts, signal-to-noise ratios, and resolutions. Graphically, such techniques are illustrated as "pulse sequences" in which the pulses are represented along with temporal relationships among them. In recent years, pulse sequences have been developed which permit extremely rapid acquisition of a large amount of raw data. Such pulse sequences permit significant reduction in the time required to perform the examinations. Time reductions are particularly important for acquiring high resolution images, as well as for suppressing motion effects and reducing the discomfort of patients in the examination process.

Particularly dramatic reductions in acquisition time have been obtained through a technique referred to as echo planar imaging (EPI). In EPI, a bi-polar gradient waveform is used concurrently with the echo-train acquisitions. Each echo in the echo train is individually phase-encoded, usually by a small blip gradient pulse, to produce a line of k-space data. In doing so, multiple k-space lines can be acquired in a single excitation. The k-space lines acquired in a single excitation can be used to reconstruct an image, a technique known as "single-shot EPI." Alternatively, the k-space lines from multiple excitations can be combined for image reconstruction, a technique known as "multi-shot EPI." The single-shot technique can provide excellent temporal resolution (less than 100 ms), whereas multi-shot EPI can be used to improve spatial resolution.

In another examination type, known as diffusion-weighted (DW) imaging, pulse sequences are specifically adapted to provide contrast between molecules having different degrees of freedom of movement. In this type of imaging, diffusion-weighting gradients are produced which sensitize resulting signals to the small random movements of molecules. Contrast can be provided in this manner between molecules which are relatively free to diffuse, such as cerebrospinal fluid, and those which are relatively more constrained, such as tissues with densely packed cells.

Diffusion-weighted imaging has been combined with EPI techniques to provide useful tools for specific clinical applications. In particular, DW-EPI techniques have been successfully used for early detection of cerebral ischemia. The DW-EPI technique is often preferred due to its effectiveness in suppressing motion artifacts as may result from bulk patient motion. In DW-EPI sequences, a pair of diffusion-weighting gradient lobes with high amplitude straddle a 180° refocusing RF pulse. The diffusion-weighting gradient sensitizes the MR signals to the diffusion of water molecules which can be subsequently used as a contrast mechanism to distinguish different tissues.

Due to the high amplitudes of the gradient lobes employed in diffusion-weighted imaging, disturbances resulting from eddy currents can be produced. Such eddy currents generally arise from the changes in the magnetic field associated with the diffusion-weighting gradient pulses. These magnetic fields can induce currents in certain conductive materials in the vicinity of the gradient coils, such as thermal shields in the magnet bore. Although the behavior of such eddy currents can be modeled or analyzed when eddy current exceed certain threshold, minute residual eddy currents are difficult to measure directly, making modeling and analysis impractical. Such minute residual eddy currents produce perturbations in the magnetic field system that can result in image artifacts such as shift, distortion, and intensity reduction in DW-EPI images.

Techniques have been developed for compensating for eddy current effects in DW-EPI. One such technique is described in U.S. Pat. No. 5,864,233, assigned to the assignee of the present invention.

While the compensation technique produces good results, it requires a priori knowledge of the time constants and amplitudes of the residual eddy currents, which are difficult to obtain in the presence of noise, as stated above. Thus, there remains a need for a compensation technique that does not rely on the knowledge of the time constants and amplitudes. In particular, there is a need to obtain the eddy current compensation parameters from an empirical measurement that faithfully characterize the residual eddy current status of the MR system. By applying the compensation parameters thus derived to the DW-EPI pulse sequences, the new compensation technique should considerably reduce, or even eliminate, the image quality problems in DW-EPI, including image shift, distortion, and intensity reduction.

SUMMARY OF THE INVENTION

The invention provides a technique adapted to respond to these needs. The technique is particularly well suited to characterizing multiple eddy current components in DW-MRI pulse sequences. The technique may be used, however, on a variety of pulse sequences and on any suitable scanner or MRI apparatus. The perturbing magnetic fields resulting from the eddy currents can be decomposed into a spatially invariant component and a series of linear gradient components. The technique may be conveniently employed as a calibration sequence that characterizes the effects of residual eddy current magnetic fields.

In one embodiment, the technique makes use of a series of reference scans, each providing a different combination of the axes on which diffusing-weighting and readout gradients are applied. Another reference set is produced with no diffusion-weighting gradients. In a preferred embodiment slice-select gradients are applied to a selected axis in the reference scans. In alternative embodiments, alternate planes could be chosen for different readout/slice-select gradient combinations. The resulting data are processed to identify the effects of eddy current magnetic fields in each raw data set, such as by one-dimension Fourier transformation, followed by linear phase fitting to identify constant and linear phases which correspond to the perturbing magnetic field constant and linear components. The phase errors thus identified may form the basis for computation of corrections to the DW-EPI pulse sequence which compensate for the eddy current magnetic fields.

DETAILED DESCRIPTION OF THE INVENTION

Figure 1:
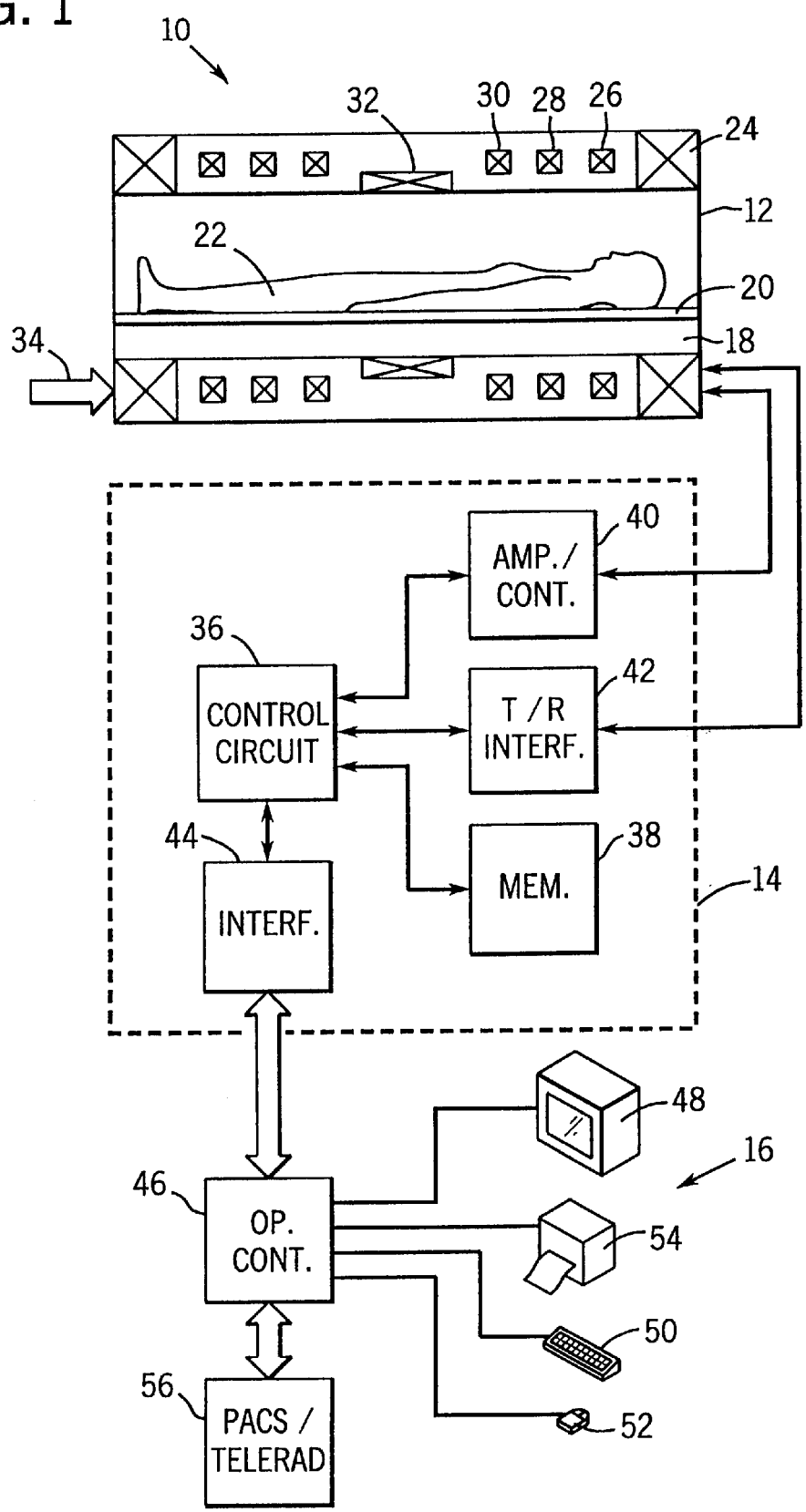
FIG. 1 is a diagrammatical representation of an MRI system designed to carry out a DW-EPI pulse sequence examination as well as a measurement sequence in accordance with the present technique.

Turning now to the drawings, and referring first to FIG. 1, a magnetic resonance imaging (MRI) system 10 is illustrated diagramatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desired position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radio frequency excitation pulses, and for detecting emissions from nuclear spins within the patient in response to such pulses. In the diagrammatical view of FIG. 1, a primary magnet coil 24 is provided for generating a primary or B0 magnetic field generally aligned with patient bore 18. A series of gradient coils 26, 28 and 30 are grouped in a coil assembly for generating controlled magnetic gradient fields during examination as described more fully below. A radio frequency coil (RF) 32 is provided for generating RF pulses for exciting the nuclear spins. In the embodiment illustrated in FIG. 1, coil 32 also serves as a receiving coil. Thus, RF coil 32 may be coupled with a transmitting and receiving switch circuit for outputting radio frequency excitation pulses, and receiving emissions from the subject. Alternatively, various configurations of receiving coils may be provided separately from RF coil 32. Such coils may include structures specifically adapted for target anatomies, such as head coil assemblies, and so forth. Moreover, receiving coils may be provided in any suitable physical configuration, including phased array coils, and so forth.

The coils of scanner 12 are controlled by external circuitry to generate desired fields and pulses, and to receive emissions from the gyromagnetic material in a controlled manner. As will be appreciated by those skilled in the art, when the material, typically protons in tissue, such as water and fat, is subjected to the primary field, individual magnetic moments of the protons attempt to aligned with the field but precess in a random order at their characteristic or Larmor frequency. While a net magnetic moment is produced in the direction of the polarizing field, the randomly oriented components of the moment in a perpendicular plane generally cancel one another when a large number of spins are considered. During an examination sequence, an RF pulse is generated at or near the Larmor frequency of the material of interest, resulting in rotation of the net aligned moment to produce a net transverse magnetization. Electromagnetic signals in the RF range can be detected following the termination of the excitation signals. These signals are then processed to reconstruct the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a linear variation in the overall magnetic field strength across the volume of interest. Combinations of such fields, orthogonally disposed with respect to one another, enable the creation of a linear gradient in any direction by vector addition of the individual gradient fields.

The gradient fields may be considered to be oriented both in physical axes, as well as by logical axes. In the physical sense, the gradient fields are mutually orthogonal to form a coordinate system defined with respect to the magnet and gradient coil configuration. In a logical sense, the coordinate system is defined with respect to the axes typically referred to by gradient fields, including read out (or frequency-encoding) gradients, phase-encoding gradients, and slice-select gradients.

The slice-select gradient determines a slab of tissue or anatomy to be imaged in the patient. The slice-select gradient field may thus be applied simultaneous with a selective RF pulse to excite a known volume of spins within a desired slice that precess within a desired frequency range. The slice thickness is determined by the bandwidth of the RF pulse and the gradient strength perpendicular to the slice.

A second logical gradient axis, the frequency-encoding gradient axis is also known as the readout gradient axis, and is applied in a direction perpendicular to the slice-select gradient. In general, the frequency-encoding gradient is applied before and during the formation of the MR signal resulting from the RF excitation. Spins under the influence of this gradient are frequency-encoded according to their spatial position across the gradient field. By Fourier transformation, acquired signals may be analyzed to identify their location along the frequency-encoding direction within the selected slice.

Finally, the phase-encoding gradient is applied in a direction orthogonal to both the slice-select and readout gradients. Localization of spins in the phase-encoding direction is accomplished by sequentially inducing variations in phase of the precessing protons of the material by using slightly different gradient amplitudes that are sequentially applied during the data acquisition sequence. Phase variations are thus linearly imposed across the field of view, and spatial position along the phase-encoding direction within the slice is encoded by the polarity and the degree of phase difference accumulated relative to a null position. As will be appreciated by those skilled in the art, a great number of variations may be devised for pulse sequences employing the logical axes described above.

The coils of scanner 12 are controlled by scanner control circuitry 14 to generate the desired magnetic field and RF pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired raw data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving RF coil 32. Moreover, where the RF coil serves both to transmit the RF excitation pulses and to receive MR signals, circuitry 42 will typically include a switching device for toggling the RF coil between active or transmitting mode, and passive or receiving mode. A power supply, denoted generally by reference numeral 34 in FIG. 1, may also be controlled by control circuit 36 to supply energization current to the primary magnet 24. Finally, circuitry 14 includes interface components 44 for exchanging configuration and raw data with system control circuitry 16.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, raw data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems (PACS), teleradiology systems, and the like.

It has been found that in scanner structures and circuitry such as those illustrated in FIG. 1, eddy currents can be generated during certain pulse sequences as a result of changing gradient fields. In particular, such eddy currents may be generated in support structures of scanner 12, in coil structures, and so forth. Moreover, depending upon the combination of physical gradients employed to provide the desired image slice orientation, complex eddy currents may be generated. As a result of such eddy currents, perturbing magnetic fields are generated which can result in image artifacts due to deviations from the desired magnetic field established by the gradients.

Figure 2:
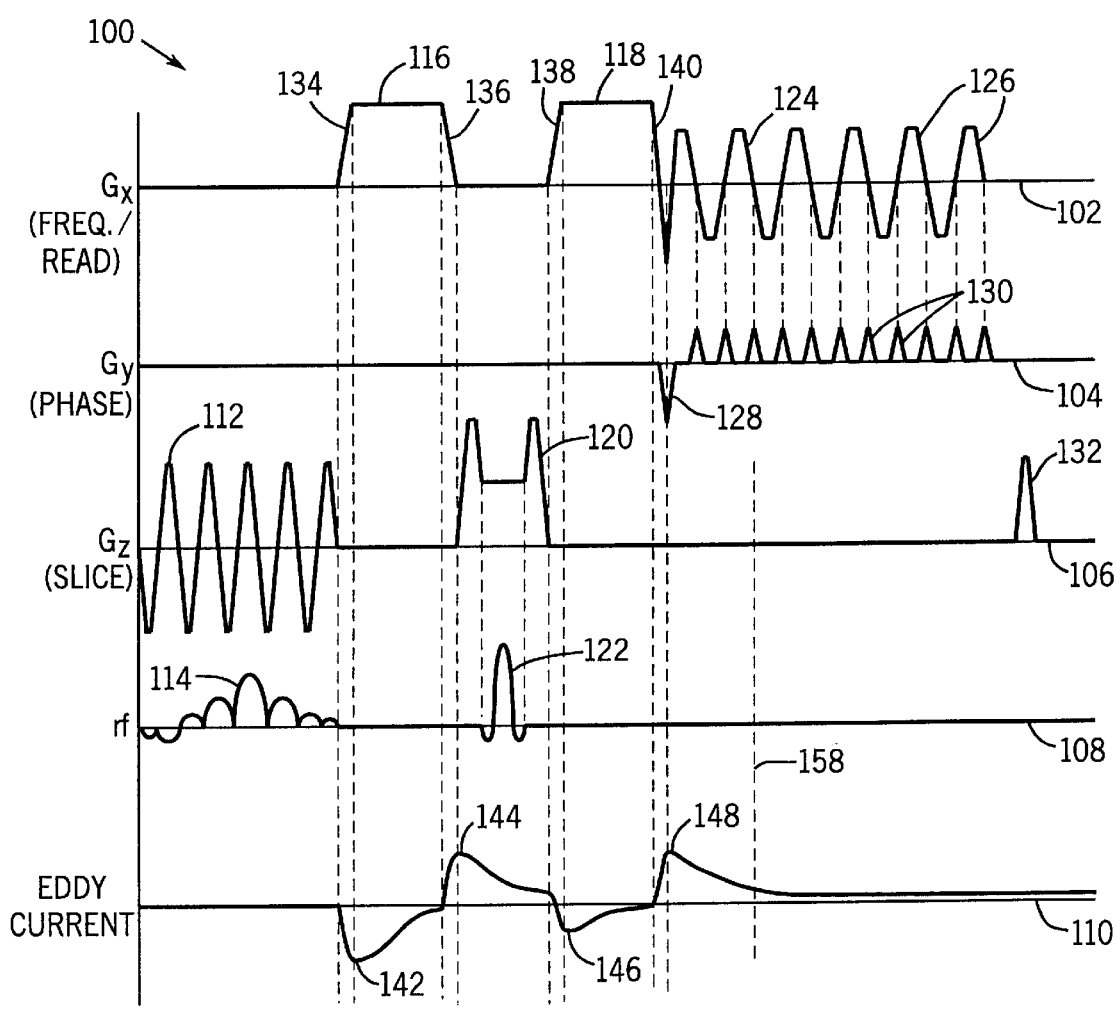
FIG. 2 is a graphical representation of a DW-EPI pulse sequence of the type executed on the system of FIG. 1.

FIG. 2 illustrates an exemplary DW-EPI pulse sequence which may be carried out on the system of FIG. 1, resulting in such eddy currents. The pulse sequence, designated generally by reference numeral 100, may be represented by a series of pulses executed on logical axes of the system. These include an x-axis 102 for frequency-encoding and readout, a y-axis 104 for phase-encoding, a z-axis 106 for slice-select, and an RF axis 108. Also illustrated in FIG. 2, a series of eddy currents may result from changes in the gradients of the pulse sequence, as illustrated on axis 110.

The DW-EPI pulse sequence of FIG. 2 begins with a series of oscillating slice-select gradients 112 executed on the logical z-axis 106. At the same time as this pulse sequence, a series of radio frequency pulses 114 is produced by the radio frequency coil to select a certain spectral frequency in a specific spatial location. Following the slice-select pulses, a first diffusion-weighting gradient pulse 116 is applied to the logical x-axis 102. As discussed below, to provide a desired level of diffusion contrast, gradient 116 preferably has a relatively high amplitude. A second diffusion-weighting gradient 118 is applied following pulse 116, with a slice-select pulse 120 being interposed between these gradients, as well as a refocusing pulse 122 applied to the radio frequency axis 108. In the readout direction of the pulse sequence, a series of bipolar frequency-encoding gradients 124 are applied to the logical x-axis 102, with a series of lobes 126 of alternating positive and negative polarity. During this portion of the examination, a first phase-encoding gradient 128 is applied to axis 104, followed by a series of pulses or "blips" 130, each being applied at a point where the frequency-encoding gradients 126 cross the frequency-encoding axis. The pulse sequence terminates in a short slice-select gradient 132 to destroy any remaining phase coherence in the transverse magnetization.

As will be appreciated by those skilled in the art, rapid onset and termination of the large diffusion-weighting gradients 116 and 118 may result in perturbing eddy currents. As illustrated in FIG. 2, while the diffusion-weighting gradients ideally have perfectly vertical attack and decay segments, due to limitations and constraints in the circuitry and coil electromagnetic properties, relatively steep ramps 134 and 136 bound gradient 116, with similar sloping ramps 138 and 140 bound in gradient 118. These ramps of onset and termination, nevertheless, may be sufficiently steep to produce eddy currents as indicated along axis 110. In the illustrated embodiment, attack segment 134 of pulse 116 produces a first, negative-going eddy current 142 whose resulting magnetic field generally opposes the magnetic field change established by ramp 134. The decay segment 136 of pulse 116 produces an opposite eddy current 144. A further eddy current 146 results from attack segment 138 of pulse 118, with a decay segment 140 of the same pulse producing an opposite polarity eddy current 148. The eddy currents may be further affected by other pulses in the sequence. However, in the case of diffusion-weighting pulse sequences, the eddy currents may be largely or primarily the result of variable additive diffusion-weighting gradients.

Figure 3:
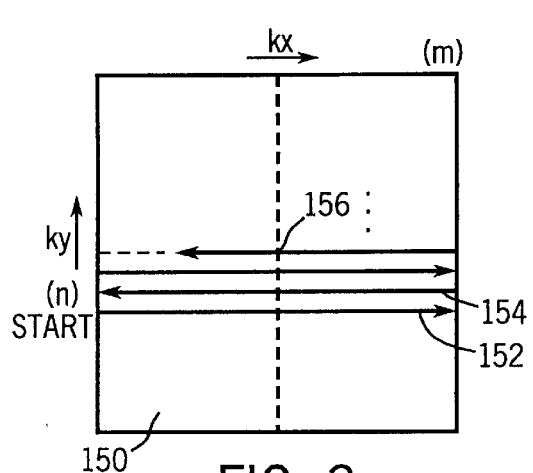
FIG. 3 is a graphical representation of acquisition of k-space raw data using the pulse sequence of FIG. 2.

Data collected during the pulse sequence of FIG. 2 are generally represented as filling lines of "k-space" as illustrated in FIG. 3. In general, as the data are collected in the time domain, a k-space frame 150 is populated with raw data in a horizontal or kx direction and a vertical or ky direction. Each readout pulse 126, in conjunction with phase-encoding pulses 128 and 130 as represented in FIG. 2, produces a subsequent line of raw data as indicated by reference numerals 152 and 154 in FIG. 3. The lines of data are generally represented as being acquired in opposite directions due to the alternating polarity of the readout gradients 126. In the ky direction, the lines may be acquired in various orders, such as beginning at the bottom or the top of the k-space frame. However, in a preferred pulse sequence, a first line of data 152 is acquired at a position below a center line 156 of the k-space frame, proceeding in an ascending direction given the orientation illustrated in FIG. 3. For example, while only 4 lines of data are shown in FIG. 3, where 80 lines of data are acquired in the pulse sequence of FIG. 2, the first line 152 may be acquired 16 lines below the center 156 in the ky direction. As will be apparent to those skilled in the art, this offset places the center of k-space in a location in the pulse sequence of FIG. 2 corresponding to a similarly positioned readout gradient, as indicated by reference numeral 158.

Referring again to FIG. 2, the presence of perturbing fields resulting from induced eddy currents may significantly affect the data acquired during the readout window of the pulse sequence. In particular, the eddy currents and their resulting magnetic fields, are generated by the ascending and descending ramps of gradients 116 and 118, tending to decay exponentially thereafter. However, the trailing edge of the decaying eddy current extends into and through the time period in which the readout is performed.

Figure 4:
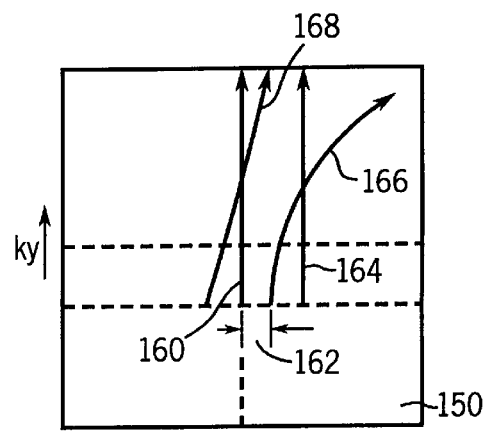
FIG. 4 is a graphical representation of certain types of anomalies which may result from eddy current magnetic fields.

Eddy current effects may have various repercussions on data collected during the DW-EPI pulse sequence. FIG. 4 represents certain anomalies which may occur due to eddy currents acting on the readout axis as represented in k-space. FIG. 4 represents tendencies or traces of echo time shift errors in k-space examination data of the type shown in FIG. 3. The present technique is based on the echo time shifts as they relate to phase errors after Fourier transformation. It should be noted that the calibration could be based upon detection of echo peak shifts directly from raw data (i.e. without taking row transformation as described below). With no perturbing effects, the data should trace a straight vertical line situated at the center of k-space in the kx direction. However, both constant (spatially invariant), linear and other errors may occur, due to the eddy current effects. In the examples illustrated in FIG. 4, an offset 162 from the center of k-space in the kx direction, may occur. Moreover, while the offset alone may affect the trace, as indicated at straight but offset line 164, various profiles may be traced as represented by lines 166 and 168. Moreover, more complex, non-linear errors may occur as indicated at trace 170. It should be noted that the foregoing discussion of FIG. 4 assumes that the phase-encoding gradient is turned off.

The present technique offers a method for characterizing the effects of eddy currents and similar magnetic field perturbations and, where desired, for compensating for the eddy current effects. In a present embodiment, the technique begins with acquisition of a series of reference raw data sets. From the acquired data, the effects of eddy currents on the physical axis of the scanner can be characterized, including characterization of both the spatially invariant components and linear gradient components. Based upon these data, the DW-EPI pulse sequence may be adapted to offset the calibrated or measured eddy-current fields.

Figure 5:
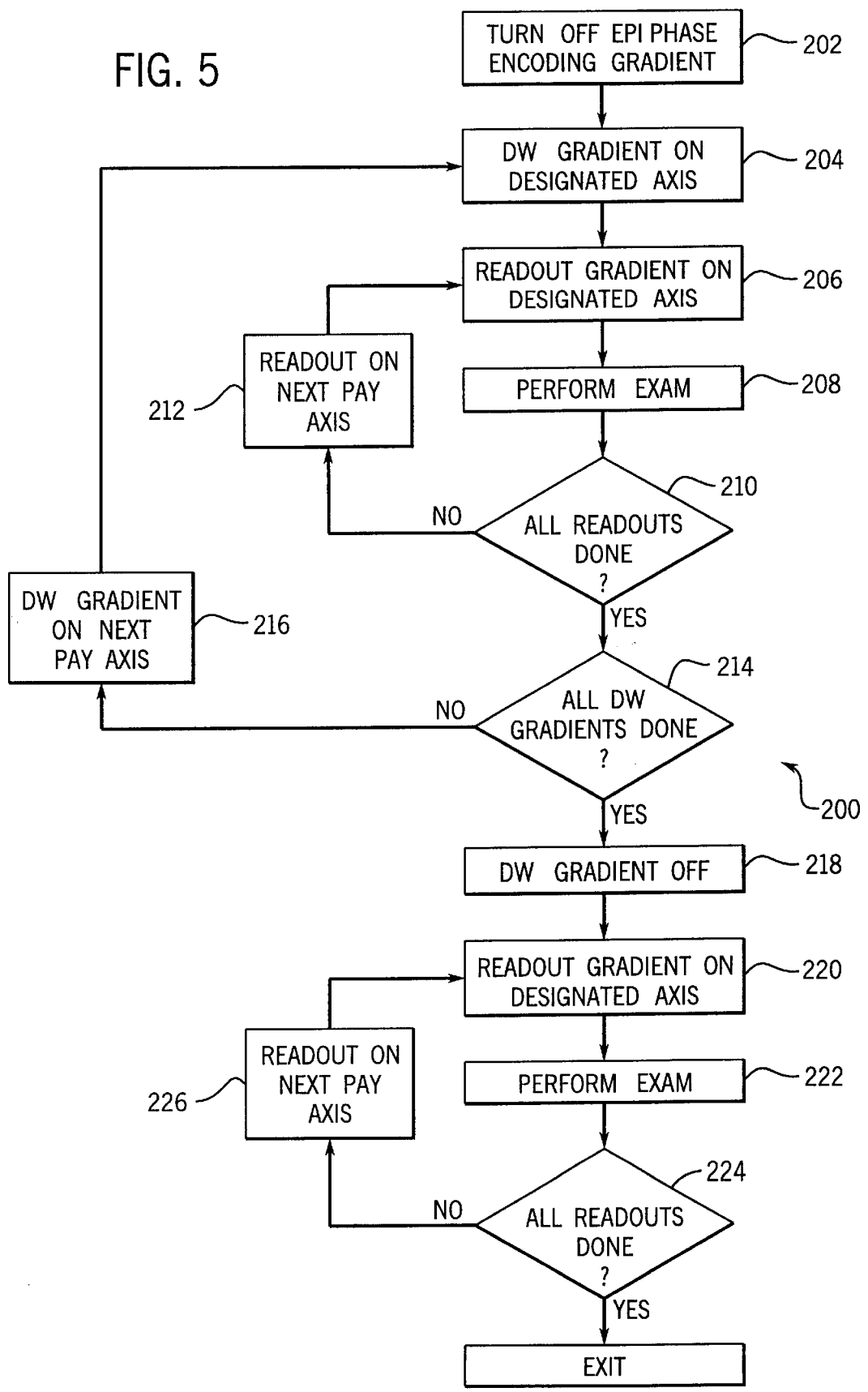
FIG. 5 is a flow chart indicating exemplary steps in control logic for acquisition of a series of reference raw data sets for an eddy current magnetic field calibration sequence.
Figure 6:
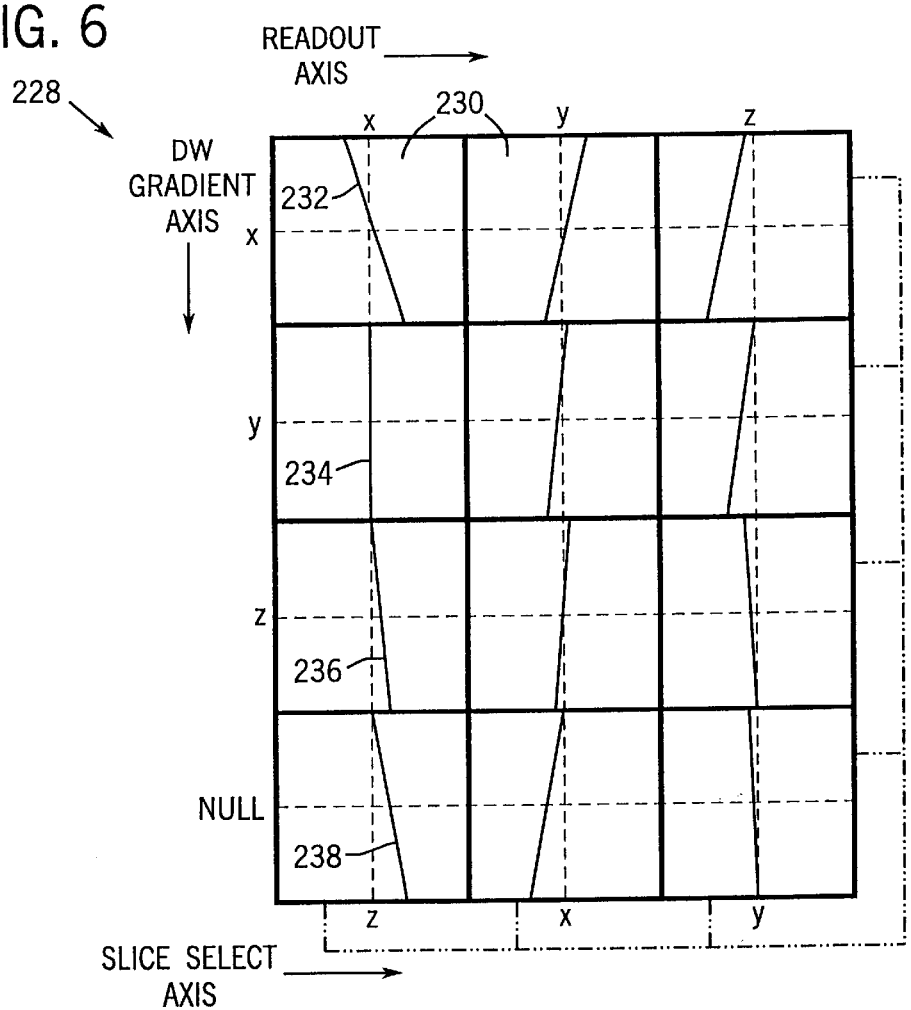
FIG. 6 is a graphical representation of k-space magnitude data for the raw data sets acquired through the logic of FIG. 5, indicating certain anomalies in the raw data caused by magnetic field perturbations.

FIG. 5 represents steps in exemplary control logic for producing a series of 12 reference raw data sets used in the calibration sequence. This control logic, designated generally by reference numeral 200, begins at step 202 where a pulse sequence description is developed in which the EPI logical phase-encoding gradient is inactivated. As indicated at step 204, the diffusion-weighting gradients are programmed on a first designated physical axis of the scanner. For example, during the first execution of step 204, the diffusion-weighting gradients may be placed on the physical x-axis of the scanner. At step 206, the readout gradient and the slice-select gradient of the DW-EPI pulse sequence are programmed on designated physical axes. It should be noted that in the embodiment described herein, the axes on which the readout gradients are applied through the calibration sequence are determined in a single predetermined set of combinations with axes on which the slice-select gradients are applied. As described in greater detail below, the resulting data sets form a matrix as illustrated in FIG. 6. However, where desired, data sets for other combinations of readout and slice-select axes may be obtained as indicated in broken lines in FIG. 6.

With this programming and pulse sequence description in place, a DW-EPI calibration is performed on a phantom, such as a silicon-oil (dimethyl liquid silicon) filled sphere at step 208. It should be noted that while any suitable phantom may be employed, reliable results have been obtained through the use of a 10 cm spherical phantom. Moreover, it has been found desirable to minimize the effective dimension of the phantom perpendicular to the readout direction. Enhanced accuracy is obtained by providing saturation pulses in the calibration pulse sequence, particularly when larger phantoms are used, prior to the 90° RF pulse to effectively eliminate top and bottom regions of the spherical phantom.

Following acquisition of the raw data, a determination is made at step 210 whether similar examinations have been performed with the readout gradients applied on all three physical axes. If not, the readout and slice select gradients are programmed for the next physical axes as indicated at step 212, and control returns to step 206 to perform a subsequent examination at step 208. Once a set of raw data has been obtained for readout gradients on all three physical axes, control advances to step 214 where it is determined whether examinations have been performed for pulse sequences in which the diffusion-weighting gradients have been applied to each of the three physical axes. If this is not the case, control advances to step 216 where the diffusion-weighting gradients are programmed for the next physical axis.

When the response at step 214 is affirmative, this indicates that a series of nine reference experiments have been performed in which diffusion-weighting gradients have been applied to all three physical axes, as have the readout gradients.

At step 218 a pulse sequence description is developed in which the diffusion-weighting gradients are turned off. As indicated at step 220, the readout gradients are then programmed for designated physical axes, such as the physical x-axis (and the slice select gradient is also programmed on a desired axis y or z). At step 222 the programmed pulse sequence is executed in an examination and the resulting raw data are acquired. At step 224 a determination is made as to whether examinations have been performed with the readout gradients on each of the physical axes. If not, the readout gradients are programmed for the next physical axis at step 226, and control returns to step 220 for execution of a subsequent examination at step 222. Once data have been acquired for each of the physical axes, control advances from step 224 as described below.

It will be noted that the logic of FIG. 5 produces a series of twelve single-shot EPI reference experiments all with the EPI phase-encoding gradient turned off. In particular, nine data sets are obtained for the combinations of readout and diffusion-weighting gradients on the three physical axes of the system. Additional three data sets are obtained for no diffusion-weighting gradients, but with readout gradients provided on the three physical axes. This calibration sequence may be summarized in tabulated form as follows:

TABLE 1

| diffusion gradient axis (donor) | readout gradient axis (recipient) | scan notation | scan number |
|---|---|---|---|
| x | x | ref_xx | 1 |
| x | y | ref_xy | 2 |
| x | z | ref_xz | 3 |
| y | x | ref_yx | 4 |
| y | y | ref_yy | 5 |
| y | z | ref_yz | 6 |
| z | x | ref_zx | 7 |
| z | y | ref_zy | 8 |
| z | z | ref_zz | 9 |
| Null | x | ref_0x | 10 |
| Null | y | ref_0y | 11 |
| Null | z | ref_0z | 12 |

Using the nomenclature of the foregoing table, the acquired data may be represented in matrix form as follows: (Eq. 1):

$$R = \begin{bmatrix} R_{xx}(m,n) & R_{yx}(m,n) & R_{zx}(m,n) & R_{0x}(m,n) \\ R_{xy}(m,n) & R_{yy}(m,n) & R_{zy}(m,n) & R_{0y}(m,n) \\ R_{xz}(m,n) & R_{yz}(m,n) & R_{zz}(m,n) & R_{0z}(m,n) \end{bmatrix}$$

where Rpq(m,n) is a non-phase-encoded echo signal acquired with the diffusion-weighting gradient applied along the p or donor axis (p can be x, y, z, or Null) and readout along the q or recipient axis (q can be x, y, or z), m is the readout sample index for a given echo (m=1, 2 ... M), and n is the echo index in the EPI echo train (n=1, 2, ... N).

FIG. 6 represents, graphically, raw data acquired through the logic of FIG. 5. The calibration data set, indicated generally by reference numeral 228, includes a series of individual data sets 230. It should be noted that each frame corresponds to an element of the matrix summarized above. That is, a frame of data is provided for each combination of readout gradient and diffusion-weighting gradient axes. As discussed above with respect to FIG. 4, various anomalies may be apparent from the raw data owing to the effects of eddy currents produced by the pulses of the experimental pulse sequences. In particular, the axis on which the diffusion-weighting gradients are applied during the calibration or test routine of FIG. 5 may be thought of as "donor" axis, producing unwanted eddy currents, while the axis on which the readout pulse sequences are applied may be thought of as a "recipient" axis. The set of raw data illustrated in FIG. 6, therefore, provides various combinations of the eddy current donor and recipient axes. As indicated generally in FIG. 6, the reference data may exhibit constant or spatially invariant errors, and linear gradient errors, as indicated by reference numerals 232, 234, 236 and 238. The data sets in FIG. 6 may be used to identify and characterize a complete set of such errors.

Figure 7:
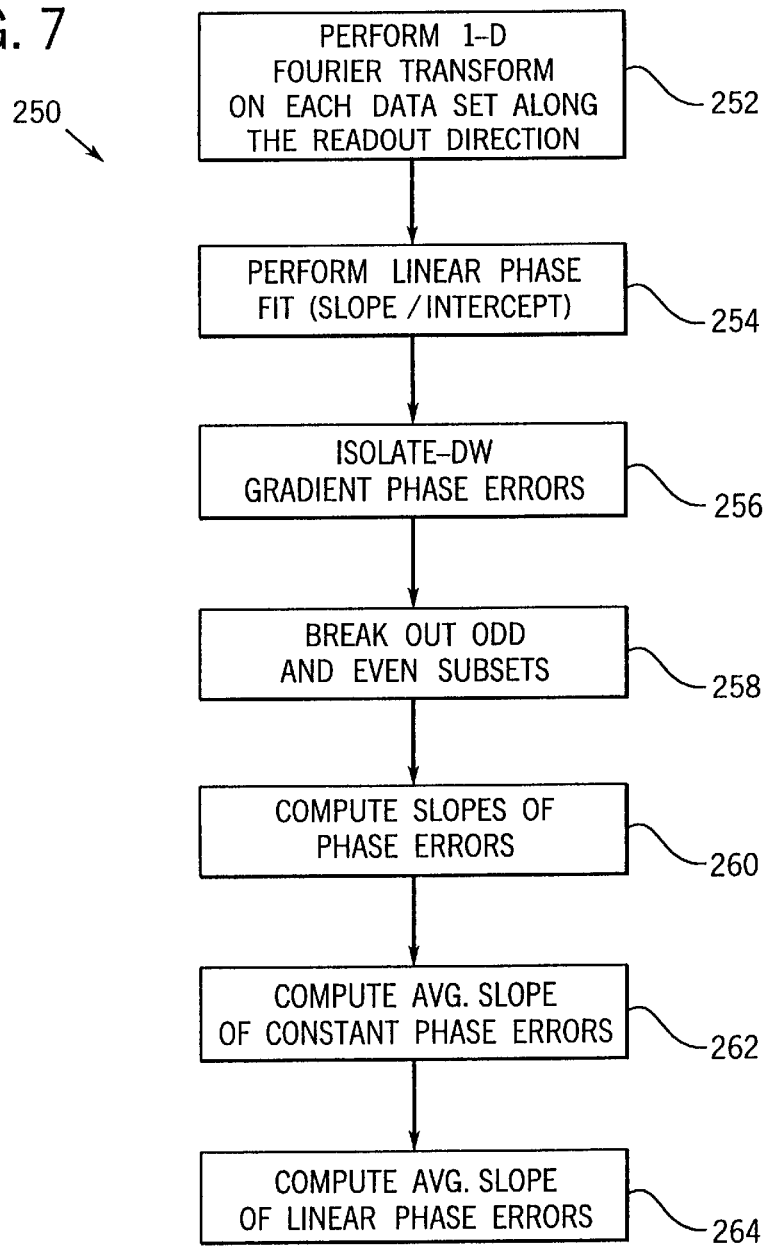
FIG. 7 is a flow chart indicating exemplary control logic for identifying eddy current effects in the data sets illustrated in FIG. 6 and acquired through the logic of FIG. 5.

FIG. 7 represents steps in exemplary control logic for analyzing the raw data collected during the calibration sequence to perform such characterization. The control logic, designated generally by reference numeral 250, begins at step 252 where a one-dimensional Fourier transformation is performed on each data set along the readout direction. In particular, the Fourier transformation is performed on each matrix element Rpq(m,n) of the matrix identified above with respect to m (Eq. 2):

$$P = FT(R) = \begin{bmatrix} P_{xx}(u,n) & P_{yx}(u,n) & P_{zx}(u,n) & P_{0x}(u,n) \\ P_{xy}(u,n) & P_{yy}(u,n) & P_{zy}(u,n) & P_{0y}(u,n) \\ P_{xz}(u,n) & P_{yz}(u,n) & P_{zz}(u,n) & P_{0z}(u,n) \end{bmatrix},$$

where (Eq. 2a)

$$P_{pq}(u,n) = \sum_{m=-M/2}^{M/2-1} R_{pq}(m,n) e^{-i2\pi m u \Delta k_x \Delta x},$$

and $\Delta k_x$ and $\Delta x$ are the k-space increment and spatial increment along the readout direction, respectively, and u is the spatial domain index conjugated to m in the embodiment described (u=1, 2, ... , U).

At step 254, from the Fourier transformed data, a linear phase fitting with respect to u is performed, which yields a constant phase $\phi'_{0,pq}(n)$ and a linear phase $\phi'_{1,pq}(n)$ (Eqs. 3 and 4):

$$\phi'_0 = \begin{bmatrix} \phi'_{0,xx}(n) & \phi'_{0,yx}(n) & \phi'_{0,zx}(n) & \phi'_{0,0x}(n) \\ \phi'_{0,xy}(n) & \phi'_{0,yy}(n) & \phi'_{0,zy}(n) & \phi'_{0,0y}(n) \\ \phi'_{0,xz}(n) & \phi'_{0,yz}(n) & \phi'_{0,zz}(n) & \phi'_{0,0z}(n) \end{bmatrix},$$

$$\phi'_1 = \begin{bmatrix} \phi'_{1,xx}(n) & \phi'_{1,yx}(n) & \phi'_{1,zx}(n) & \phi'_{1,0x}(n) \\ \phi'_{1,xy}(n) & \phi'_{1,yy}(n) & \phi'_{1,zy}(n) & \phi'_{1,0y}(n) \\ \phi'_{1,xz}(n) & \phi'_{1,yz}(n) & \phi'_{1,zz}(n) & \phi'_{1,0z}(n) \end{bmatrix}.$$

Figure 8:
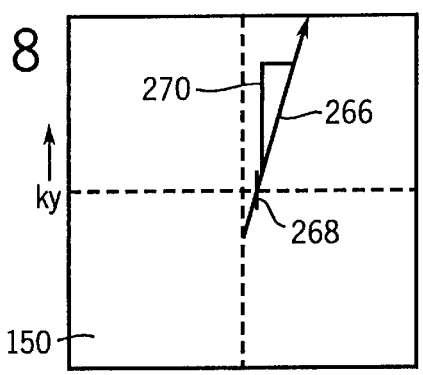
FIG. 8 is a graphical representation of certain of the information computed through the logic of FIG. 7.

The foregoing linear phase fitting effectively identifies the progression or tendency of errors in the k-space data as illustrated in FIG. 8. Since the slope of the phase with respect to u corresponds to the k-space data shift along the $k_x$ direction, each point along reference numeral 266 represents a position of the echo peak for a given echo index (or $k_y$ index), as well as a linear phase value. It should be noted that the first three columns of the above matrices contain phase errors arising from both diffusion-weighting gradient related factors and non-diffusion-weighting gradient factors, such as magnetic field inhomogeneity, eddy currents induced by the readout gradients, and so forth. As indicated at step 256 in FIG. 7, to single out the phase errors related only to the diffusion-weighting gradients, the phase errors are calibrated using the data in the last columns of the foregoing equations (corresponding to the null or reference examinations) as follows (Eqs. 5 and 6):

$$\phi_0 = \begin{bmatrix} \phi_{0,xx}(n) & \phi_{0,yx}(n) & \phi_{0,zx}(n) \\ \phi_{0,xy}(n) & \phi_{0,yy}(n) & \phi_{0,zy}(n) \\ \phi_{0,xz}(n) & \phi_{0,yz}(n) & \phi_{0,zz}(n) \end{bmatrix}$$

$$= \begin{bmatrix} \phi'_{0,xx}(n)-\phi'_{0,0x}(n) & \phi'_{0,yx}(n)-\phi'_{0,0x}(n) & \phi'_{0,zx}(n)-\phi'_{0,0x}(n) \\ \phi'_{0,xy}(n)-\phi'_{0,0y}(n) & \phi'_{0,yy}(n)-\phi'_{0,0y}(n) & \phi'_{0,zy}(n)-\phi'_{0,0y}(n) \\ \phi'_{0,xz}(n)-\phi'_{0,0z}(n) & \phi'_{0,yz}(n)-\phi'_{0,0z}(n) & \phi'_{0,zz}(n)-\phi'_{0,0z}(n) \end{bmatrix},$$

$$\phi_1 = \begin{bmatrix} \phi_{1,xx}(n) & \phi_{1,yx}(n) & \phi_{1,zx}(n) \\ \phi_{1,xy}(n) & \phi_{1,yy}(n) & \phi_{1,zy}(n) \\ \phi_{1,xz}(n) & \phi_{1,yz}(n) & \phi_{1,zz}(n) \end{bmatrix}$$

$$= \begin{bmatrix} \phi'_{1,xx}(n)-\phi'_{1,0x}(n) & \phi'_{1,yx}(n)-\phi'_{1,0x}(n) & \phi'_{1,zx}(n)-\phi'_{1,0x}(n) \\ \phi'_{1,xy}(n)-\phi'_{1,0y}(n) & \phi'_{1,yy}(n)-\phi'_{1,0y}(n) & \phi'_{1,zy}(n)-\phi'_{1,0y}(n) \\ \phi'_{1,xz}(n)-\phi'_{1,0z}(n) & \phi'_{1,yz}(n)-\phi'_{1,0z}(n) & \phi'_{1,zz}(n)-\phi'_{1,0z}(n) \end{bmatrix}.$$

Because the readout gradients produced in the DW-EPI pulse sequence are of alternating polarity, the above data may be broken out in odd and even subsets, as indicated at step 258 in FIG. 7, to obtain the matrices (Eqs. 7, 8, 9 and 10):

$$\Phi_{0,odd} = \begin{bmatrix} \phi_{0,xx}(2h-1) & \phi_{0,yx}(2h-1) & \phi_{0,zx}(2h-1) \\ \phi_{0,xy}(2h-1) & \phi_{0,yy}(2h-1) & \phi_{0,zy}(2h-1) \\ \phi_{0,xz}(2h-1) & \phi_{0,yz}(2h-1) & \phi_{0,zz}(2h-1) \end{bmatrix},$$

$$\Phi_{0,even} = \begin{bmatrix} \phi_{0,xx}(2h) & \phi_{0,yx}(2h) & \phi_{0,zx}(2h) \\ \phi_{0,xy}(2h) & \phi_{0,yy}(2h) & \phi_{0,zy}(2h) \\ \phi_{0,xz}(2h) & \phi_{0,yz}(2h) & \phi_{0,zz}(2h) \end{bmatrix},$$

$$\Phi_{1,odd} = \begin{bmatrix} \phi_{1,xx}(2h-1) & \phi_{1,yx}(2h-1) & \phi_{1,zx}(2h-1) \\ \phi_{1,xy}(2h-1) & \phi_{1,yy}(2h-1) & \phi_{1,zy}(2h-1) \\ \phi_{1,xz}(2h-1) & \phi_{1,yz}(2h-1) & \phi_{1,zz}(2h-1) \end{bmatrix},$$

$$\Phi_{1,even} = \begin{bmatrix} \phi_{1,xx}(2h) & \phi_{1,yx}(2h) & \phi_{1,zx}(2h) \\ \phi_{1,xy}(2h) & \phi_{1,yy}(2h) & \phi_{1,zy}(2h) \\ \phi_{1,xz}(2h) & \phi_{1,yz}(2h) & \phi_{1,zz}(2h) \end{bmatrix}.$$

Following computation of the matrices in Eqs. 7–10, the slope of each element in each matrix is computed with respect to h (where h indexes the values from 1 to N/2) at ky=0 (i.e., the echo location which corresponds to the center of the k-space in the phase-encoded EPI echo train), as indicated at step 260 in FIG. 7. The resulting slope matrices thus obtained are represented as, for the constant phase slopes (Eqs. 11, 12):

$$\Psi_{0,odd} = \begin{bmatrix} \psi_{0,xx,o} & \psi_{0,yx,o} & \psi_{0,zx,o} \\ \psi_{0,xy,o} & \psi_{0,yy,o} & \psi_{0,zy,o} \\ \psi_{0,xz,o} & \psi_{0,yz,o} & \psi_{0,zz,o} \end{bmatrix},$$

$$\Psi_{0,even} = \begin{bmatrix} \psi_{0,xx,e} & \psi_{0,yx,e} & \psi_{0,zx,e} \\ \psi_{0,xy,e} & \psi_{0,yy,e} & \psi_{0,zy,e} \\ \psi_{0,xz,e} & \psi_{0,yz,e} & \psi_{0,zz,e} \end{bmatrix},$$

and for the linear phase (Eqs. 13, 14):

$$\Psi_{1,odd} = \begin{bmatrix} \psi_{1,xx,o} & \psi_{1,yx,o} & \psi_{1,zx,o} \\ \psi_{1,xy,o} & \psi_{1,yy,o} & \psi_{1,zy,o} \\ \psi_{1,xz,o} & \psi_{1,yz,o} & \psi_{1,zz,o} \end{bmatrix},$$

$$\Psi_{1,even} = \begin{bmatrix} \psi_{1,xx,e} & \psi_{1,yx,e} & \psi_{1,zx,e} \\ \psi_{1,xy,e} & \psi_{1,yy,e} & \psi_{1,zy,e} \\ \psi_{1,xz,e} & \psi_{1,yz,e} & \psi_{1,zz,e} \end{bmatrix}.$$

It should be noted that the final subscript in each matrix element indicates odd or even echoes. It should also be noted that each element in the matrices is a scalar quantity, rather than a function of echo index as in Eqs. 3–10. Finally, as an alternative to the particular processing described above, slopes of the data sets with diffusion weighting gradient activated and slopes of the reference data sets could be computed and a difference between these slopes could subsequently be found to determine the offset described above.

Figure 9:
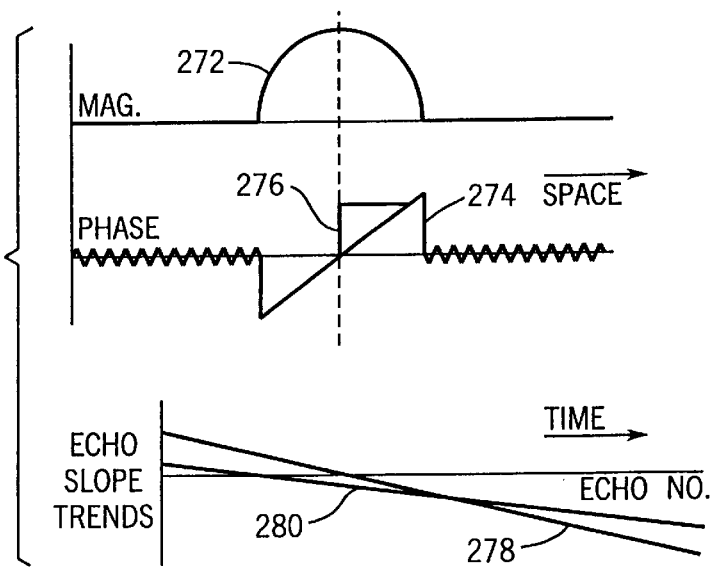
FIG. 9 is a graphical representation of additional data computed through the logic of FIG. 7.

The slope matrices computed at step 260 correspond generally to slopes identified graphically in the lower traces in FIG. 9. Specifically, FIG. 9 represents magnitude data 272 corresponding to the post row Fourier transform of a single echo acquired for a spherical phantom. Phase data 274 are generated for the phantom and includes a portion that is descriptive of locations through the phantom. The slope 276 of the phase data is calculated in Eqs. 5–6 and the slope of slope 276 along the ky direction is shown by trace 278. Similarly, a trend of slope intercepts of the trace 274 is computed as represented by trace 280.

It has been found that the constant phase errors identified by the matrices above, arise primarily from B0 field eddy currents. The slopes of the constant phase errors should be, in principle, identical between odd and even echoes. In practice, however, slight differences may be observed because of experimental noise. Following the logic summarized in FIG. 7, at step 262, the average slope of the constant phase errors is next computed as follows (Eq. 15):

$$\Psi_0 = \frac{1}{2}(\Psi_{0,odd} + \Psi_{0,even}) \equiv \begin{bmatrix} \psi_{0,xx} & \psi_{0,yx} & \psi_{0,zx} \\ \psi_{0,xy} & \psi_{0,yy} & \psi_{0,zy} \\ \psi_{0,xz} & \psi_{0,yz} & \psi_{0,zz} \end{bmatrix}.$$

It should be noted that the B0 field eddy currents are independent of the recipient axis designation and are thus spatially independent. That is, the same perturbation to the B0 field is expected from a diffusion-weighting gradient on a particular physical donor axis irrespective of the readout direction or the recipient axis. Thus, the elements in each column of Eq. 15 should be similar. As indicated at step 262, averaging of these values improves accuracy. This averaging is performed in accordance with the relationship (Eq. 16):

$$\overline{\Psi}_0 = \begin{bmatrix} \overline{\psi}_{0,x} \\ \overline{\psi}_{0,y} \\ \overline{\psi}_{0,z} \end{bmatrix} = \frac{1}{3} \begin{bmatrix} \psi_{0,xx} + \psi_{0,xy} + \psi_{0,xz} \\ \psi_{0,yx} + \psi_{0,yy} + \psi_{0,yz} \\ \psi_{0,zx} + \psi_{0,zy} + \psi_{0,zz} \end{bmatrix}.$$

The units of each element in Eq. 16 are radians/ky-point.

The phase error $\overline{\psi}_0$ produces an image shift along the phase-encoding direction.

As indicated at step 264 in FIG. 7, the average slope of the linear phase errors is next computed. In particular, the results of the odd and even echoes from Eqs. 13 and 14 are averaged to obtain an average linear phase error set in accordance with the relationship (Eq. 17):

$$\Psi_1 = \frac{1}{2}(\Psi_{1,odd} + \Psi_{1,even}) \equiv \begin{bmatrix} \psi_{1,xx} & \psi_{1,yx} & \psi_{1,zx} \\ \psi_{1,xy} & \psi_{1,yy} & \psi_{1,zy} \\ \psi_{1,xz} & \psi_{1,yz} & \psi_{1,zz} \end{bmatrix}.$$

The units for the above matrix element are radians/(kx_point·ky_point). It has been found that such linear phase errors can produce image shear, compression/dilation, phase-encoding field of view direction dilation, and/or intensity reduction, depending upon the logical imaging task (readout, phase-encoding or slice-select) performed on the recipient axis.

Figure 10:
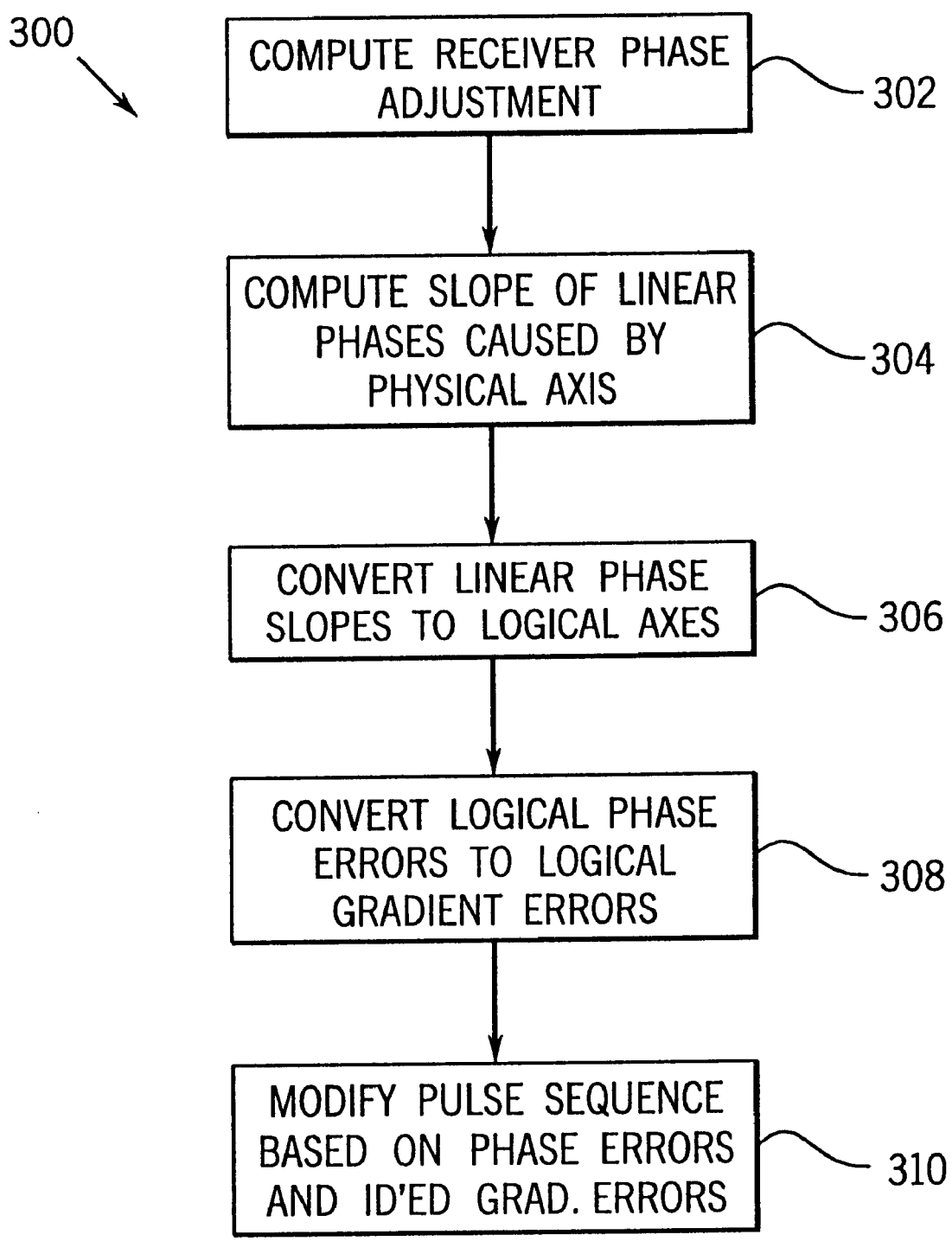
FIG. 10 is a flow chart indicating exemplary control logic for computation of correction parameters from the measured eddy current effects for compensating for such effects in a DW-EPI pulse sequence.

The foregoing computations permit identification or measurement of the constant or linear phase errors resulting from the gradient-induced eddy currents. The resulting errors may be employed to compute adjustments or compensations for use in the pulse sequences to avoid degradation which may be caused by the eddy currents. FIG. 10 represents steps in exemplary control logic for computing such compensation values.

Considering an arbitrary diffusion-weighting gradient $G_d$, the logical gradient components of which may be represented $G_{d,ro}$, $G_{d,pe}$, and $G_{d,sl}$ along the readout, phase-encoding, and slice-select directions, respectively (Eq. 18):

$$G_d = \begin{bmatrix} G_{d,ro} \\ G_{d,pe} \\ G_{d,sl} \end{bmatrix}.$$

As will be appreciated by those skilled in the art, this gradient can be converted to the physical gradient components by application of a rotation matrix $\Re$(Eq. 19):

$$G_{d,phy} = \begin{bmatrix} G_{d,x} \\ G_{d,y} \\ G_{d,z} \end{bmatrix} = \Re \begin{bmatrix} G_{d,ro} \\ G_{d,pe} \\ G_{d,sl} \end{bmatrix}.$$

The slope of the overall constant phase error (note that the phase error is constant with respect to the readout direction, but linear with respect to the phase-encoding direction) produced by $G_{d,phy}$ may be represented by the relationship (Eq.20):

$$\theta_0 = \frac{1}{G_{d,ref}} \overline{\Psi}_0 \cdot G_{d,phy} = \frac{1}{G_{d,ref}} [\overline{\psi}_{0,x} \quad \overline{\psi}_{0,y} \quad \overline{\psi}_{0,z}] \begin{bmatrix} G_{d,x} \\ G_{d,y} \\ G_{d,z} \end{bmatrix},$$

where $G_{d,ref}$ is the diffusion-weighting gradient used in the reference scans discussed above, and the unit for $\theta_0$ is radians/ky_point.

In the logic summarized in FIG. 10, designated generally by reference numeral 300, a receiver phase adjustment is first computed, as indicated at step 302, based upon this relationship. In particular, to compensate for the constant phase error identified in the foregoing equation, which can produce an image shift along the phase-encoding direction, the receiver phase can be dynamically adjusted in accordance with the relationship (Eq. 21):

$$\theta_{receiver} = \eta + n\theta_0,$$

where $\eta$ is the initial receiver phase, and n is the echo index.

At step 304, the equivalent slope of the linear phases caused by $G_{d,phy}$ is calculated in accordance with the relationship (Eq. 22):

$$\begin{bmatrix} \theta_x \\ \theta_y \\ \theta_z \end{bmatrix} = \frac{1}{G_{d,ref}} \Psi_1 \cdot G_{d,phy} = \frac{1}{G_{d,ref}} \begin{bmatrix} \psi_{1,xx} & \psi_{1,yx} & \psi_{1,zx} \\ \psi_{1,xy} & \psi_{1,yy} & \psi_{1,zy} \\ \psi_{1,xz} & \psi_{1,yz} & \psi_{1,zz} \end{bmatrix} \begin{bmatrix} G_{d,x} \\ G_{d,y} \\ G_{d,z} \end{bmatrix}.$$

Next, as indicated at step 306 in FIG. 10, the physical phase errors are converted to logical axes in accordance with the conversion relationship (Eq. 23):

$$\begin{bmatrix} \theta_{ro} \\ \theta_{pe} \\ \theta_{sl} \end{bmatrix} = \Re^{-1} \begin{bmatrix} \theta_x \\ \theta_y \\ \theta_z \end{bmatrix} = \Re^{-1} \begin{bmatrix} \theta_x \\ \theta_y \\ \theta_z \end{bmatrix},$$

where $\Re^T$ denotes the transpose of the rotation matrix.

At step 308, the resulting logical phase errors are further converted to logical gradient errors by application of the relationship (Eq. 24):

$$\begin{bmatrix} g_{ro} \\ g_{pe} \\ g_{sl} \end{bmatrix} = \frac{G_{ro}(tsp)N_{ro}}{2\pi(esp)} \begin{bmatrix} \theta_{ro} \\ \theta_{pe} \\ \theta_{sl} \end{bmatrix}.$$

where tsp is the dwell time in the readout direction, with unit $\mu$s, esp is the echo spacing, with units of: $\mu$s/ky_point, $N_{ro}$ is the readout fast Fourier transform size, and $G_{ro}$ is the readout gradient amplitude, with units of G/cm. It should be noted that all the above quantities are those used in the reference scans described above. Based upon the known gradient errors, then, the gradients of the DW-EPI pulse sequence described above with reference to FIG. 2, are modified as indicated at step 310 in FIG. 10. Specific modifications to the pulse sequence may follow generally known techniques, such as that described in U.S. Pat. No. 5,864,233, issued on Jan. 26, 1999 to Zhou et al.

It should be noted that the foregoing description is intended to provide an exemplary implementation of the techniques of the present invention. Various adaptations and modifications may be envisioned by those skilled in the art. For example, as noted above, the slope trend analysis summarized above may be carried out in a variety of manners to identify and quantify the spatially invariant and linear gradient errors. Moreover, the calibration sequence could proceed through detection of echo peak shifts directly from raw data without the row transformation described.

What is claimed is:

1. A method for identifying errors in an MRI system, the method comprising the steps of:
    acquiring a plurality of reference data sets by application of a predefined gradient pulse on each of a plurality of physical axes and application of a predefined readout pulse sequence without phase-encoding pulses on each of the plurality of physical axes; and
    analyzing each of the data sets to identify spatially invariant and linear gradient components of errors on the physical axes resulting from the gradients.

2. The method of claim 1, wherein the reference data sets include acquired data for donor experiments in which the predefined gradient pulse is applied to each of three physical axes of an MRI scanner and a null experiment in which the predefined gradient pulse is not applied to any of the physical axes.

3. The method of claim 2, wherein the reference data sets include acquired data for experiments in which the readout pulse sequence is applied to each of the physical axes for each of the three axes to which the gradient pulse is applied in the donor experiments and to each of the three axes in the null experiments.

4. The method of claim 1, wherein the predefined gradient pulse includes a pair of diffusion-weighting pulses.

5. The method of claim 1, wherein the step of analyzing includes performing a one-dimensional Fourier transformation on each data set and computing linear phase slope and intercept values for the transformed data.

6. The method of claim 5, wherein the step of analyzing further includes converting the linear phase slope and intercept values to spatially invariant and linear gradient error values.

7. The method of claim 1, wherein the step of analyzing includes approximation of error values for a center of k-space.

8. The method of claim 1, wherein the step of analyzing includes identifying parameters of errors for each data set and averaging the parameters to determine errors for each physical axis.

9. The method of claim 1, wherein the reference data sets are acquired in an echo planar imaging pulse sequence.

10. A method for calibrating effects of gradient pulses in an MRI pulse sequence, the method comprising the steps of:
    performing a first series of reference experiments to acquire first data sets in which a predetermined gradient pulse is applied along each of a plurality of physical axes and a readout pulse sequence is applied along each of the physical axes;
    performing a second series of reference experiments to acquire second data sets in which the readout pulse sequence is applied along each of the physical axes without application of the predetermined gradient pulse; and
    analyzing the first and second data sets to identify effects on the physical axes of eddy currents resulting from application of the gradients.

11. The method of claim 10, wherein the physical axes include three mutually orthogonal axes.

12. The method of claim 10, wherein the first and second series of experiments include echo planar imaging pulse sequences.

13. The method of claim 10, wherein the gradient pulse includes a pair of diffusion-weighting gradient pulses.

14. The method of claim 10, wherein the step of analyzing includes performing a one-dimensional Fourier transformation on each data set, and determining an error trend from the transformed data.

15. The method of claim 10, wherein the step of analyzing includes identifying spatially invariant and linear gradient errors resulting from the eddy currents.

16. The method of claim 10, wherein the step of analyzing includes averaging effects of eddy currents over a plurality of the data sets.

17. A method for identifying effects of diffusion-weighting gradient pulses in an echo planar imaging protocol executed on an MRI system, the method comprising the steps of:
    generating a plurality of data sets via a series of diffusion weighted echo planar imaging experiments in which diffusion weighting gradients and readout gradients, without phase-encoding pulses, are applied to each of a plurality of physical axes of an MRI scanner in predetermined combinations;
    performing a one dimensional Fourier transformation on each data set;
    analyzing the transformed data to identify spatially invariant and linear gradient errors resulting from the diffusion weighting gradients.

18. The method of claim 17, wherein the step of generating the data sets includes generating reference data sets for experiments in which readout gradients are applied without diffusion weighting gradients.

19. The method of claim 17, wherein the step of analyzing includes the step of performing a linear gradient fit on the transformed data.

20. The method of claim 19, wherein the step of analyzing includes the further step of isolating diffusion weighting gradient phase errors.

21. The method of claim 19, wherein the step of analyzing includes computing odd and even error values corresponding to positive and negative polarity pulses of the readout gradients.

22. The method of claim 17, wherein the step of analyzing includes computing averages of phase errors for each of the plurality of physical axes.

23. An MRI system comprising:
    a scanner having a plurality of gradient coils and a radio frequency coil for generating controlled magnetic fields and radio frequency pulses in accordance with predetermined imaging sequences, and for detecting resulting resonance signals from a subject of interest;
    a control circuit configured to apply control signals to the gradient coils and to the radio frequency coil to execute the imaging sequences on the scanner, the control circuit being further configured to apply controlled gradient pulses to the gradient coils during a calibration sequence and to process detected signals resulting therefrom; and
    an error calibration circuit configured to analyze the detected signals, without applying phase-encoding pulses, to identify spatially invariant and linear gradient errors resulting from application of the gradient pulses during the calibration sequence.

24. The system of claim 23, wherein the control circuit is configured to apply gradient control signals during the calibration sequence defining a diffusion weighted echo planar imaging sequence.

25. The system of claim 23, wherein the gradient coils are configured to apply magnetic field gradients along three mutually orthogonal physical axes, and wherein the gradient pulses are generated in the calibration sequence along all three physical axes.

26. The system of claim 25, wherein the error calibration circuit is configured to identify unique error values for each physical axis.

27. The system of claim 23, wherein the error calibration circuit is defined in an appropriately programmed computer.

28. The system of claim 23, wherein the error calibration circuit is configured to apply a one dimensional Fourier transform to the detected signals and to derive phase error values from resulting transformed data.

* * * * *